United States Patent [19]
Pyle et al.

[11] Patent Number: 5,737,231
[45] Date of Patent: Apr. 7, 1998

[54] METERING UNIT WITH ENHANCED DMA TRANSFER

[75] Inventors: Michael W. Pyle, Hermitage; David C. Carlson, Murfreesboro, both of Tenn.

[73] Assignee: Square D Company, Palatine, Ill.

[21] Appl. No.: 653,831

[22] Filed: May 28, 1996

Related U.S. Application Data

[63] Continuation of Ser. No. 159,884, Nov. 30, 1993, abandoned.

[51] Int. Cl.$^6$ .................................................. G01R 21/06
[52] U.S. Cl. ...................... 364/483; 364/492; 324/76.11
[58] Field of Search ..................................... 364/483, 482, 364/492; 324/76.24, 76.15, 76.38, 76.42, 76.58, 107, 76.12, 76.11; 361/78, 79, 85, 86, 87; 307/353, 510, 354; 365/222

[56] References Cited

U.S. PATENT DOCUMENTS

| | | | |
|---|---|---|---|
| 4,227,798 | 10/1980 | Steiner | 365/222 X |
| 4,377,833 | 3/1983 | Udren | 364/482 X |
| 4,388,611 | 6/1983 | Haferd | 364/483 X |
| 4,556,842 | 12/1985 | Rosswurm | 324/107 X |
| 4,667,152 | 5/1987 | Hayes et al. | 324/76.24 |
| 4,689,752 | 8/1987 | Fernandes et al. | 364/492 |
| 4,855,671 | 8/1989 | Fernandes | 364/483 X |
| 4,979,122 | 12/1990 | Davis et al. | 364/483 |
| 5,081,454 | 1/1992 | Campbell, Jr. et al. | 341/141 |
| 5,164,875 | 11/1992 | Haun et al. | 361/64 |
| 5,224,054 | 6/1993 | Wallis | 364/483 |
| 5,233,538 | 8/1993 | Wallis | 364/483 |
| 5,243,537 | 9/1993 | Neumann | 364/483 X |
| 5,247,454 | 9/1993 | Farrington et al. | 364/483 |

OTHER PUBLICATIONS

Robert A. Kennedy and Donald N. Rickey, Monitoring and Control of Industrial Power Systems, IEEE, pp. 42–46, Oct., 1989.

National Semiconductor, LM12458 12–Bit + Sing Data Acquisition System with Self–Calibration, pp. 1–28, Oct., 1991.

Square D Company, Power Monitoring and Control Systems, pp. 1–49, Jun. 5, 1990.

*Primary Examiner*—James P. Trammell
*Assistant Examiner*—M. Kemper
*Attorney, Agent, or Firm*—Kareem M. Irfan; Larry I. Golden

[57] ABSTRACT

An improved metering unit is described which samples a power-related waveform and simultaneously captures its analog signal parameters for temperature and all phases of voltage and current, providing a more accurate and clearer waveform sample that effectively detects harmonics problems and does not require signal interpolation methods. The improved metering unit comprises signal conditioning circuitry interfacing with the power line for sensing temperature and all desired phases of voltage and current parameters of the waveform. The metering unit further comprises a processor having a timer output. The timer output controls track and hold circuitry and an A/D converter. The timer output places the track and hold circuitry in the hold mode to simultaneously capture temperature and all the desired phases of voltage and current of the waveform, and, at the same time, the timer output triggers the A/D converter to convert the captured analog signal parameters into digital sample values.

16 Claims, 7 Drawing Sheets

METERING UNIT WITH ENHANCED DMA TRANSFER

This application is a continuation of application Ser. No. 08/159,884, filed Nov. 30, 1993, now abandoned.

FIELD OF THE INVENTION

The present invention relates generally to the practice of sensing electrical power, and more particularly, to techniques and arrangements for measuring, communicating and analyzing parameters associated with electrical distributed power networks.

BACKGROUND OF THE INVENTION

Industrial power users are rapidly becoming aware of the importance of monitoring distributed power networks. Proper monitoring can provide tangible benefits with respect to equipment operation and maintenance; therefore, significant return on investment. More specifically, these benefits include savings in terms of equipment energy cost and maintenance costs, better equipment utilization, and increased system reliability.

Electric utility applications have ranged from supervisory control and data acquisition (SCADA) systems, primarily concerned with remote operations, to distribution automation, which focuses on operating efficiency. Certain utility applications have included devices mounted on power lines for sensing operating parameters of an associated power conductor. For example, in U.S. Pat. Nos. 4,158,810, 4,261,818, and 4,709,339, line mounted sensor modules have been described which measure the magnitudes of signal parameters associated with power lines. These parameters include current, voltage, conductor temperature and ambient temperature. Once captured by the sensor module, data corresponding to these parameters is remotely processed and evaluated.

Current power monitoring systems monitor power parameters at various points of a power line distributed network and provide data corresponding to such measurements to a central point for analysis and evaluation. These systems utilize remote, microprocessor-based sensor units located at the various monitoring points in the network to measure signal parameters associated with a waveform passing through that point in the power line network. The metering unit captures the waveform by sampling the waveform at predetermined sampling time intervals over an integral number of cycles, where a cycle reflects the period of the waveform. Systems of this type represent a significant improvement over traditional power line monitoring techniques, but these systems have certain limitations.

Current metering units sample voltage and current readings in a sequential manner. For example, in a three-phase, four-line power line configuration, the metering unit, at the end of each sampling time interval, samples $V_1$ and $I_1$, converts $V_1$ and $I_1$ to digital values and reads the digital values; then the metering unit samples $V_2$ and $I_2$, converts $V_2$ and $I_2$ to digital values and reads the digital values; and finally, the metering unit samples $V_3$ and $I_3$, converts $V_3$ and $I_3$ to digital values and reads the digital values. The microprocessor-based metering unit utilizes these digital values to calculate certain power-related measurements, such as the RMS (root mean square) voltages between the phases. Unfortunately, the metering unit must perform a linear interpolation method upon the RMS voltages because the $V_1$–$V_3$ a voltages are sequentially sampled and cannot be measured at precisely the same time. Although this interpolation technique is fairly accurate, it is only an approximation and could miss some harmonics problems in the network.

Furthermore, this sequential sampling of the waveform by the metering unit requires a significant amount of microprocessor intervention. Typical microprocessor-controlled analog to digital (A/D) acquisition consumes a large amount of the available microprocessor bandwidth. The microprocessor must control sample and hold circuits, analog to digital converters and the reading of the digitized values. When the sampling, converting and reading occurs on several channels (i.e. the various waveform signal parameters such as voltages and currents in all phases), the demand upon the microprocessor is greatly increased.

Due to the great demand upon the microprocessor in sampling, converting and reading of the signal parameters, some current metering units utilize two microprocessors, one for metering and calculations that are independent of time and the other for remote communication and calculations which are dependent on time. The communications involve communicating with a remote station or other system features, such as a power fail flag, watch dog circuitry or additional external devices.

Thus, there is a need for a monitoring system for a distributed power network that can be efficiently implemented to reduce the required microprocessing power for the metering units and more effectively sample signal parameters to present a clearer waveform and, consequently, improved detection of harmonics problems within the network. By reducing the required microprocessing power for the metering unit, the microprocessor is free to perform additional functions and, thereby, improving the capabilities of the metering unit. In addition, if the microprocessor can perform the functions associated with other components, then those components can be eliminated, resulting in cost savings.

SUMMARY OF THE INVENTION

It is a general object of the present invention to provide an improved metering unit for a circuit monitoring system in a distributed power network that requires less microprocessor interaction during acquisition of signal samples.

It is a more specific object of the present invention to provide an improved metering unit that simultaneously samples a waveform for all phases of voltage and current to more accurately measures waveform signal parameters.

It is also an object of the present invention to provide an improved metering unit for a circuit monitoring system that more accurately samples waveforms and, consequently, more effectively detects harmonics problems within the distributed power network.

It is another object of the present invention to provide an improved metering unit that more effectively stores historical waveform data within non-volatile memory to ensure the integrity of the data within the non-volatile memory upon power loss.

In accordance with a preferred embodiment of the present invention, the improved metering units of the present invention are utilized in a circuit monitoring system for a distributed power network, in which power-related waveforms are passed through a multitude of network branches and associated loads and wherein zero-crossings of the waveform define their respective cycles. The system includes a plurality of improved metering units of the present invention, each of which is disposed adjacent an associated one of the branches, for obtaining waveform parameters and for generating and transmitting data representative thereof. Furthermore, a control station can be coupled to each of the metering units for generating monitoring commands and operating parameters to the plurality of metering units and for receiving and evaluating the data transmitted therefrom.

The metering unit of the present invention samples the waveform and simultaneously captures its analog signal parameters for temperature and all desired phases of voltage and current, providing a more accurate and clearer waveform sample that effectively detects harmonics problems and does not require signal interpolation methods. The improved metering unit comprises signal conditioning circuitry interfacing with the power line for sensing temperature and all phases of voltage and current parameters of the waveform passing through the power line. The metering unit further comprises a processor having a timer output. The timer output controls track and hold circuitry and an A/D converter. The timer output places the track and hold circuitry in the hold mode to simultaneously capture or sample the temperature and all the desired phases of voltage and current, and, at the same time, the timer output triggers the programmable A/D converter to convert the captured analog signal parameters into digital sample values.

Preferably, the A/D converter is programmable and continues converting the analog signal parameters into digital sample values until all analog signal parameters for a given capture have been converted. Accordingly, the processor programs the timer output to have a duty cycle such that all the analog signals are held by the track and hold circuitry until all the analog signal parameters for a given sample are digitized before the next waveform sample. The processor also programs the frequency of the timer output to obtain the desired inter-sample time interval. As the programmable A/D converter converts the analog signal parameters on the analog channels, the programmable A/D converter puts the converted digital sample values into a FIFO buffer. When the number of digital sample values in the FIFO exceeds a predetermined number or programmed setpoint, the programmable A/D sends a DMA request to the microprocessor. Upon receipt of the DMA request, DMA controller circuitry of the microprocessor begins transferring the digital sample values from the FIFO to microprocessor memory for power-related calculations to be performed on the digital sample values.

The normal DMA circuitry of the microprocessor allows multiple data transfers from a single fixed memory location or sequential memory locations to the same number of sequential memory locations in the microprocessor memory. In a preferred embodiment of the present invention, the metering unit includes DMA enhancement circuitry to permit the transfer of digital values that are 9-16 bits wide over a relatively inexpensive 8-bit wide data bus from the programmable A/D converter to the microprocessor memory. The microprocessor addresses two sequential memory locations of the A/D converter, addr0 and addr1, for accessing the FIFO of the A/D converter and reads the 9-16 bit digital sample value from the two sequential, 8-bit ("byte") wide FIFO memory locations. Actually, the microprocessor sends a fixed source address to read the 9-16 bit digital value from the FIFO memory location at addr0, but the digital data at addr0 is only 8 bits or a byte wide. Consequently, addr0 only contains the least significant byte of the 9-16 bit digital value. Therefore, the processor retrieves the least significant byte of the digital sample value from addr0 corresponding to the FIFO and stores it in the microprocessor memory at a desired destination address. After fetching the least significant byte of the digital sample value, the DMA control circuitry of the processor increments the destination address.

On the next fetch from the FIFO to obtain the remaining most significant bits of the digital sample value, the DMA control circuitry continues to send the fixed source address, but the DMA enhancement circuitry alters the least significant address bit of the address received by the A/D such that the A/D converter actually receives an address coinciding with addr1. Addr1 holds the most significant byte of the digital sample value from the FIFO. As such, the microprocessor actually retrieves the most significant byte of the 9-16 bit digital value from addr1 of the A/D converter corresponding to the FIFO buffer, and the DMA control circuitry stores the most significant bits of the digital sample value in an incremented destination address in processor memory. Therefore, the processor stores the 9-16 bit digital sample value in sequential locations in the microprocessor memory.

Additionally, the improved motoring unit of the present invention includes non-volatile memory for storing sample, operational and calculated data. Unfortunately, if a set of contiguous bytes representing some data were being written into non-volatile memory when control power is lost, the data would be corrupted or "torn" because the written data would consist partially of previous data and partially of new data. The improved metering unit prevents this corruption of data on loss of control power with a contiguous non-volatile memory protection feature.

BRIEF DESCRIPTION OF THE DRAWINGS

Other objects and advantages of the invention will become apparent upon reading the following detailed description and upon reference to the drawings in which.

While the invention is susceptible to various modifications and alternative forms, a specific embodiment thereof has been shown by way of example in the drawings and will herein be described in detail. It should be understood, however, that it is not intended to limit the invention to the particular forms disclosed, but on the contrary, the intention is to cover all modifications, equivalents, and alternatives falling within the spirit and scope of the invention as defined by the appended claims.

DESCRIPTION OF THE PREFERRED EMBODIMENTS

Figure 1:
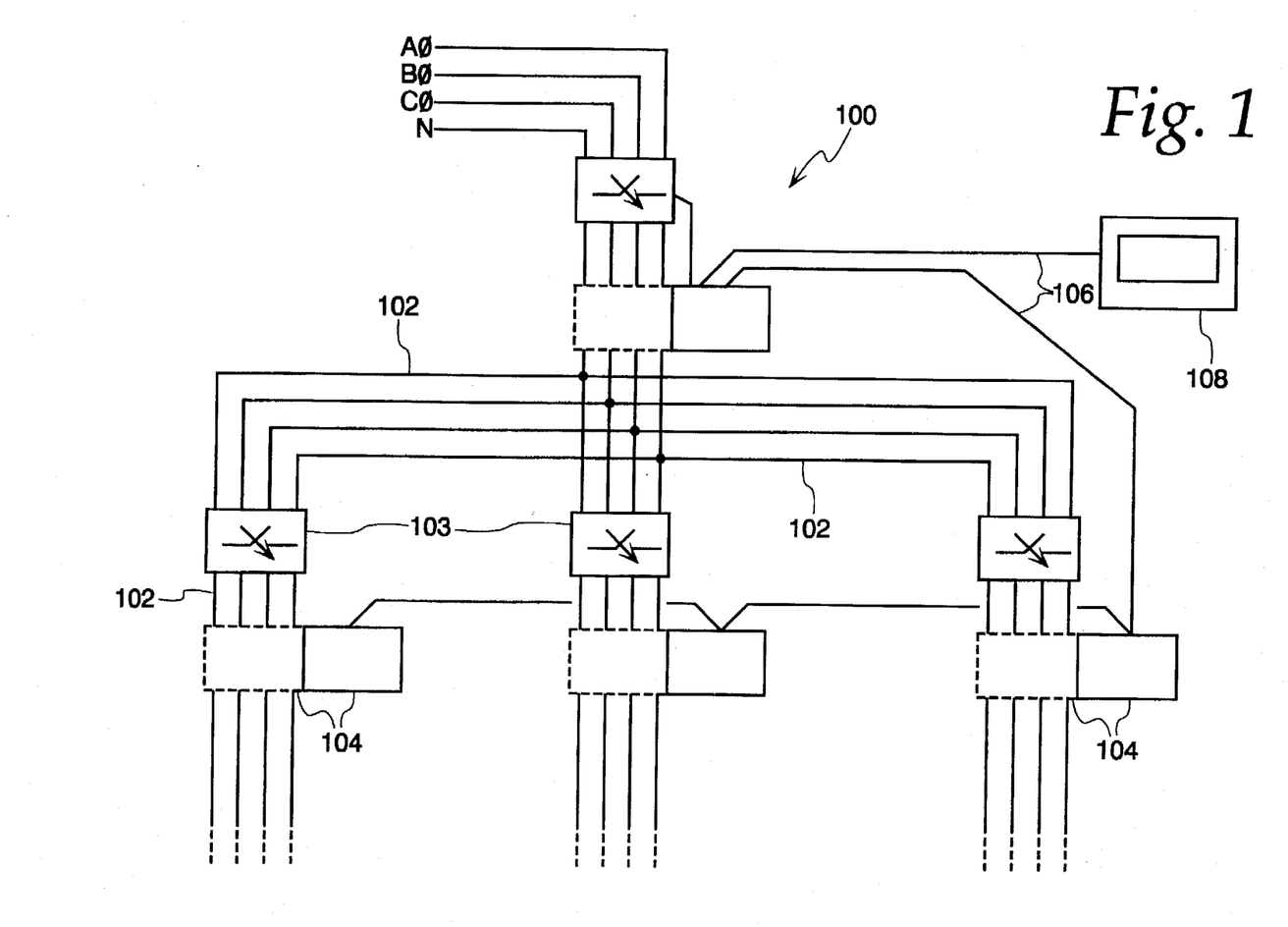
FIG. 1 is a diagram of a three-phase distributed power network having a monitoring system coupled thereto, in accordance with the present invention, for monitoring and evaluating power parameters in the network.

The present invention is particularly advantageous in industrial applications wherein a distributed power network supplies power to a multitude of loads, e.g., various types of power equipment. FIG. 1 illustrates such an application in which a three-phase (A, B, C), four-wire (A–C, N) distribution system 100 feeds a number of network branches 102 and associated loads (not shown). While this system could be modified to accommodate a three-phase/three-wire, or other implementation, the system shown in FIG. 1 is representative, and the present invention is discussed in the context of this illustrated implementation.

In the system of FIG. 1, the network branches 102 include conventional interruption devices 103 for "breaking" the circuit path defined thereby. Adjacent the interruption devices 103, the system includes associated metering units 104, each of which is communicatively coupled via a communication link 106 to a control station 108. The communication link 106 may be implemented using the protocol set forth in SY/MAX® Instruction Bulletin, Dec. 8, 1988, available from Square D Company, Palatine, Ill. Together, the metering units 104, the communication link 106 and the control station 108 are used to implement a retro-fittable monitoring system for the distribution system 100. The control station 108 is preferably implemented using a desk-top controller, e.g., an IBM PC/AT® and compatibles, having a keyboard, a display and a processor for sending commands and for analyzing information sent from the metering units 104.

The monitoring system of FIG. 1 provides a user, located at the control station 108, the ability to monitor the electrical activity in each branch, or at each load, remotely. Equally important, the communication link 106 and the control station 108 provide a conveniently located control point at which electrical activity at various points in the system can be monitored at certain predetermined times, under preselected conditions, and analyzed and evaluated for ongoing system and equipment maintenance and control. Using the control station 108, for example, all the metering units 104 may be instructed to sample the power in the associated network branches 102 at any given time. This sampling time can be preprogrammed by the control station 108, thereby collecting power-related information from all the network branches simultaneously. This is an important advantage, because it can be used to provide an overall evaluation of the system without having to compensate for errors that result from time-dependent system variations.

Figure 2:
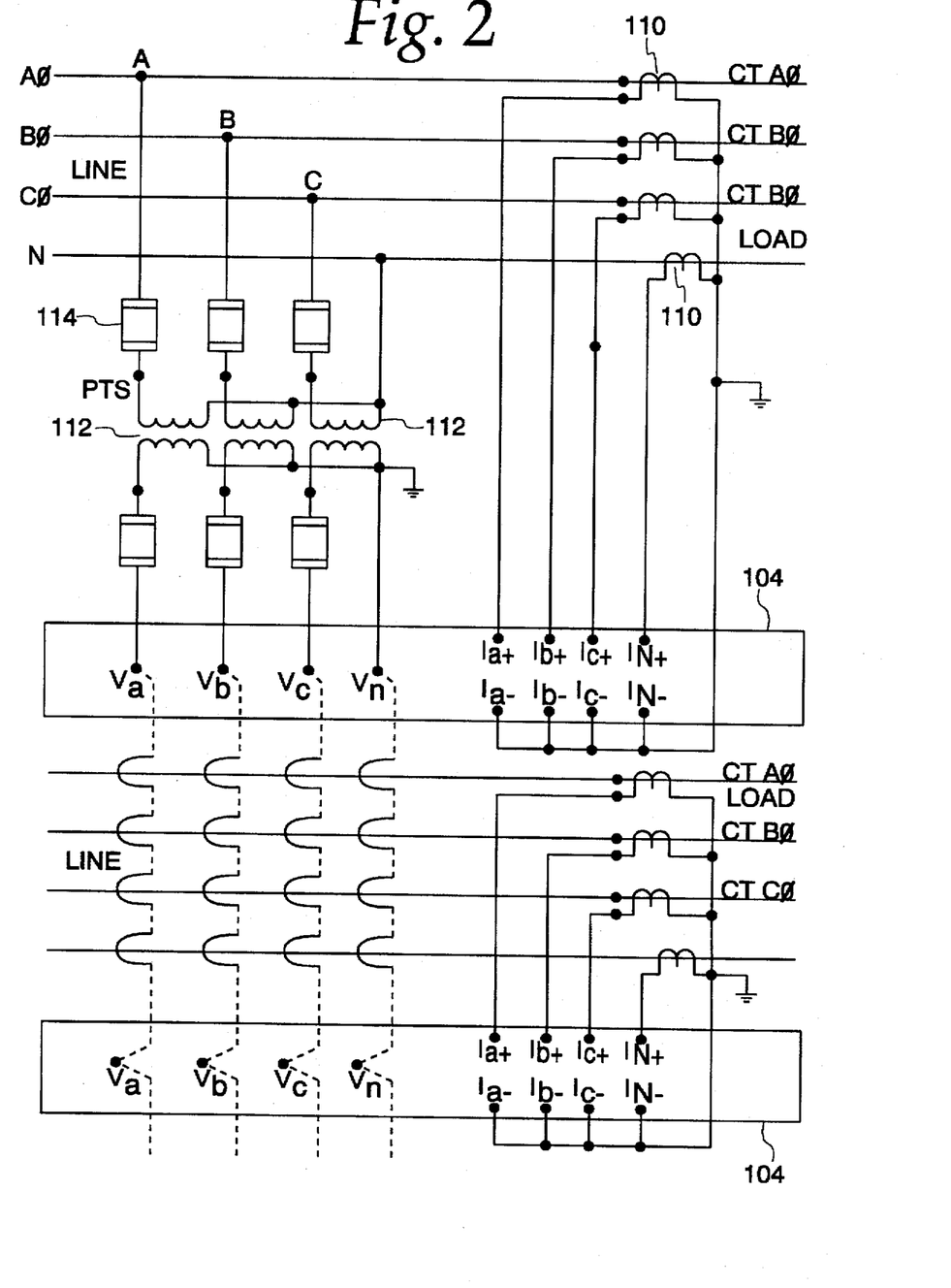
FIG. 2 is a diagram illustrating, in more detail, the manner in which the system of FIG. 1 is coupled to the three-phase distributed power network.

FIG. 2 illustrates a manner in which the metering units 104 of FIG. 1 may be coupled to the lines in each of the network branches 102. As shown in FIG. 2, one current transformer (CT) 110 is used for each phase and neutral line associated with each metering unit 104 with one side of each CT 110 electrically connected to ground for the associated metering unit 104. However, three potential transformers (PT) 112 may be shared by more than one metering unit 104 by arranging the PTs 112 to sense the voltages in parallel, unlike the arrangements of the CTs 110. Fuses 114 may be used to protect all the metering units 104 at their PT input terminals. Thus, a total of nine lines (twelve terminals) are used at each metering unit 104 for coupling the power-related information from the CTs 110 and PTs 112 to the metering units 104.

Figure 3:
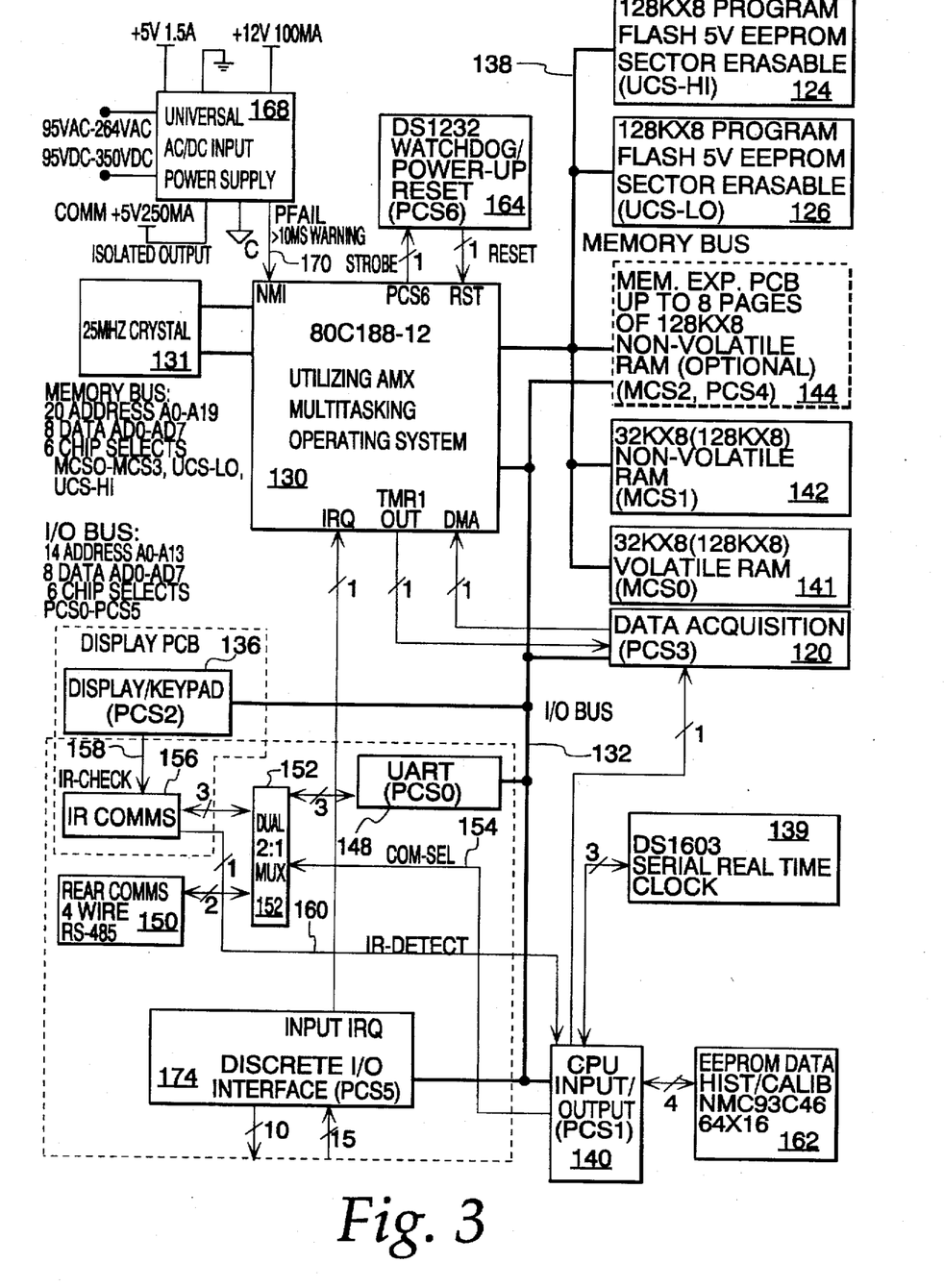
FIG. 3 is a block diagram of an improved metering unit, in accordance with the present invention, which may be used for monitoring power parameters in the network of FIG. 1 and for transmitting that information to a central point for evaluation.

A preferred manner of processing the power-related information within each metering unit 104 is illustrated in FIG. 3. Generally, the power-related information is introduced to the metering unit 104 via data acquisition unit 120. In the preferred embodiment described herein, the metering unit 104 utilizes EEPROMS 124 and 126, preferably 128×8 Program Flash 5V, sector erasable EEPROMs, to store the Boot Code firmware, the main functionality firmware and update firmware or user programmable logic. Processor 130 executes the firmware to control the operation of the metering unit 104. The processor 130 preferably operating in a AMX Multitasking Operating System is desirably coupled to a 25 MHz crystal 131 to provide a clock for the processor 130 and synchronization to the metering unit 104. An I/O bus 132 couples the processor 130 to various I/O components of the metering unit 104, such as communication circuitry 134, display/keypad circuitry 136 and the data acquisition unit 120. The I/O bus 132 can include a 14-bit wide address bus, an 8-bit wide data bus and 6 chip select lines (PCS0–PCS5). A memory bus 138 couples the processor 130 to the various memory units utilized by the preferred embodiment of the metering unit 104. The memory bus can include a 20-bit wide address bus, 8-bit wide data bus and six memory chip select lines (MCS0–MCS3, UCS-LO and UCS-HI). The processor 130 can be an 80C188-12 manufactured by Intel Corporation of Santa Clara, Calif.

The processor 130 of the preferred embodiment utilizes CPU I/O chips 140 coupled to the I/O bus 132 to provide latches, buffers and an input/output port for the address-based processor 130. The processor 130 controls the various components designated in FIG. 1 with a PCS# in parenthesis by selectively enabling the various components through the chip select lines (PCS0–PCS5) of the I/O bus 132. The processor 130 transfers data between the various components of the metering unit 104 utilizing the I/O bus 132 and the CPU I/O chips 140. Similarly, the processor 130 controls and enables the various memory components by selectively enabling the memory components through the memory select lines of the memory bus 138. Moreover, the processor 130 accesses and stores data within the various memory components using the memory bus 138. The processor 130, by enabling and controlling the digital acquisition circuitry 120 through the I/O bus 132, collects simultaneous samples of the power-related information from the CTs 110 and the PTS 112 (FIG. 2) to acquire an extremely accurate and clear representation of the current and voltage waveforms carried in the associated network branch 102. It can be desirable for all the metering units 104 to time stamp the sample data obtained from their respective branches 102 (FIG. 1). Accordingly, the metering unit 104 is equipped with a serial real-time clock 139, such as a DS1603 made by Dallas Semiconductor of Dallas, Tex.

The data acquisition circuitry 120, under the control of the processor 130, digitizes these analog samples, and the processor 130 desirably stores those digital sample values using conventional, non-volatile RAM 142 and 144.

The processor 130 collects this digital sample data and performs power-related calculation on the digital sample data as directed by the firmware. Preferably, the processor 130 utilizes a conventional RAM 141 to assist in power-related calculations involving the sample digital data. These power-related calculations preferably include: the average demands of current in each of the three phases and of real power, the predicted demand of real power, the peak demand of current in each of the three phases and of real power, the accumulated real and reactive energy, rms calculations of voltage and current, and power quality calculations such as total harmonic distortion.

The processor 130 can transmit the processed or stored digital data to the control station 108 through the communications circuitry 134 that is coupled to the I/O bus 132. The communications circuitry 134 includes a communication interface 148. In the preferred embodiment, the communication interface 148 is a UART (universal asynchronous receiver/transmitter) that receives and transmits digital signals. The communication interface 148 is coupled to the I/O bus 132 and provides two-way communication between the metering unit 104 and the control station 108 through a communication port 150.

The communication port 150 is preferably a 4-wire, RS-485 communication port and is coupled to the communication interface 148 through a multiplexor (MUX) 152. The MUX 152 is controlled by a COM-SEL bit, and, in the absence of a Optical Communications Interface (OCI), the microprocessor 130 controls the signal on a COM-SEL line 154 from the CPU I/O chips 140 to the COM-SEL bit of the MUX 152 and creates a data path between the communication interface 148 and the communication port 150. In the presence of the OCI (not shown), the processor 130 utilizes the CPU I/O chips 140 to toggle the signal on the COM-SEL line 154, and the MUX 152 alters the data path to route digital signals between the communication interface 140 and an infrared communication port 156. The infrared communication port 156 interacts with the OCI and provides an infrared communication link between the metering unit 104 and a personal computer (not shown) connected to the OCI. The OCI is preferably an infrared to RS-232 interface, and the personal computer links to the RS-232 port of the OCI interface.

The metering unit 104 includes display/keypad circuitry 136 to provide a user with a local interface with the metering unit 104. As previously stated, the display/keypad circuitry 136 is coupled to the I/O bus 132 to enable the user to interrupt the firmware operation of the microprocessor 130 and perform any desired operations upon the metering unit 104. Additionally, in the illustrated embodiment, the display/keypad circuitry 136 transmits a digital signal to the infrared communication port 156 with an IR-CHECK line 158 for determining the presence of the OCI, and, if present, the OCI responds by sending the digital signal back to the infrared communication port 156 and through an IR-DETECT line 160 to the CPU I/O chips 140. The microprocessor examines the signal on the IR-DETECT line 160 to determine if an OCI is present adjacent to the infrared communication port 156. As previously discussed, if an OCI is present, the preferred embodiment of the metering unit 104 utilizes the CPU I/O chips 140 to switch the MUX 152 into routing digital signals from the infrared communication port 156 to the communication interface 148.

Communications between the metering unit 104 and the control station 108 can be facilitated by entering the device address and the communication baud rate via the display/keypad circuitry 136. This allows the control station 108 to differentiate between the multitude of metering units 104 communicating over the communication link 106 (FIG. 1). Preferably, the designated address for the metering unit 104 can be programmed and stored in the non-volatile RAM 142 of the metering unit 104. Additionally, in a preferred embodiment for the metering unit 104, historical, calibration and identification information is preferably stored in a serial EEPROM 162 coupled to the CPU I/O chips 140. The serial EEPROM 162 is preferably a NMC93C46 EEPROM made by National Semiconductor of Santa Clara, Calif.

The metering unit 104 also includes a watchdog timer circuit 164 and a power supply 168. The watchdog timer circuit 164 is used by the processor 130 in a conventional manner to monitor its integrity, and may be implemented using a DS1232-type IC, available from Dallas Semiconductor, Inc., Dallas, Tex. In the illustrated preferred embodiment, the processor 130 must continuously strobe the watchdog timer circuit 164, and if the processor 130 halts the expected strobing, the watchdog timer circuit 164 resets the processor 130. Additionally, the watchdog timer circuitry 164 resets the processor 130 if the Vcc voltage from the power supply 168 drops below a threshold voltage value.

The power supply 168 is conventional, but the improved metering unit 104 includes a non-volatile memory protection feature upon control power loss that will be specifically described below. The power supply 168 can be fed from an AC line to provide ±12v (Volts) and +5v ("Vcc") for the entire metering unit 104 and a communication supply ("COM +5v") for the communication circuitry 134. The power supply 152 is monitored by the processor 130, using a power fail line 170 coupled to the NMI (non-maskable interrupt) of the processor 130 to interrupt its operation and allow the processor 130 to store any necessary data in non-volatile memory, such as the non-volatile RAM 142, before operating power is lost. Preferably, the power supply 152 generates the power fail signal on a power loss or power sag at least 10 ms prior to dropping the Vcc output out of regulation.

The metering unit 104 is also equipped with an I/O interface 174 coupled to the I/O bus 132 and having latches and buffers for providing optional I/O operations. For example, the I/O interface 174 can be used to trigger the interruption devices 103 (FIG. 1) when one or more predetermined conditions have been detected within the metering unit 104 or at the control station 108. Moreover, the I/O interface 174 can be coupled to an external module or monitor if desired.

An important application of the present invention concerns retro-fitting the metering unit 104, or the entire monitoring system of FIG. 1, with a previously installed interruption device 103 having a peak sensing tripping mechanism. Interruption devices of this type trip upon the detection of the peak of the waveform exceeding a predetermined threshold. Presuming the presence of a non-sinusoidal waveform, the metering units 104 of the present invention detect the peak value, calculate the RMS (root mean squared) value for a sinusoidal waveform having the same peak value and report that calculated value to the control station 108. This allows a user at the control station 108 to evaluate the suitability of the interruption device for the load connected thereto.

Figure 4:
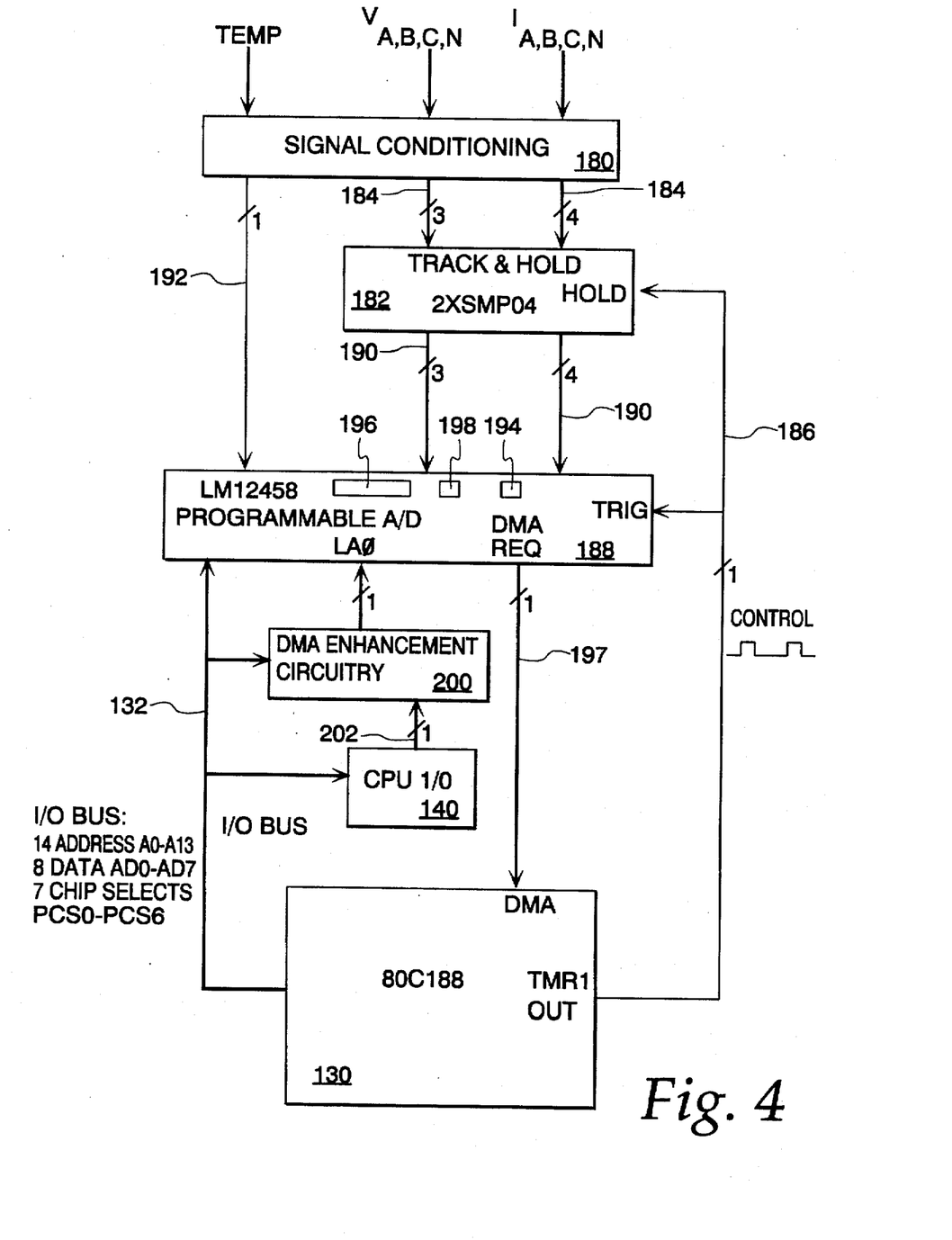
FIG. 4 is a block diagram of the data acquisition unit for the improved metering unit of the present invention.

The metering unit 104 of the present invention utilizes the data acquisition circuitry 120 to provide synchronous, simultaneous analog to digital acquisition of multiple analog channels which requires minimal microprocessor bandwidth. It is applicable to any commercial or industrial application or environment which requires synchronous analog data acquisition. In the preferred embodiment, the processor 130 controls the data acquisition circuitry to simultaneously sample all phases of voltage and current of the waveform passing through the associated branch 102 (FIG. 1). FIG. 4 shows a block diagram for the data acquisition circuitry 120. The data acquisition circuitry 120 includes signal conditioning circuitry 180 that receives the temperature and all phases of voltage and current as inputs. The signal conditioning circuitry 180 acts as an interface between the branch 102 (FIG. 1) and the metering unit 104. The signal conditioning circuitry 180 interacts with these input signals and produces analog voltage signals ($V_1$, $V_2$, $V_3$, $V_4$) representing the line voltages ($V_A$, $V_B$, $V_C$, $V_N$), analog currents signals ($I_1$, $I_2$, $I_3$, $I_4$) representing the line currents ($I_A$, $I_B$, $I_C$, $I_N$) and the temperature signal representing the ambient temperature. The ambient temperature is indicative of the temperature outside the metering unit as well as the temperature of any loads (e.g., power equipment) situated nearby. In the preferred embodiment, the signal conditioning circuitry 180 brings in the signals on the branch 102 (FIG. 1) and signal conditions eight analog channels ($V_1$, $V_2$, $V_3$, $I_1$, $I_2$, $I_3$, $I_4$, Temperature) to range from 0 to 5V peak to peak.

The signal conditioning circuitry 180 is coupled to track and hold circuitry 182 over lines 184. The track and hold circuitry 182 preferably includes two SMP04 track and hold IC's made by Analog Devices, Inc. As illustrated for the preferred embodiment, the signal conditioning circuitry 180 provides the track and hold circuitry 182 with the analog voltage signals ($V_1$, $V_2$, $V_3$) and the analog currents signals ($I_1$, $I_2$, $I_3$, $I_4$) over the lines 184. In the preferred embodiment, the Temperature signal bypasses the track and hold circuitry 182. The track and hold circuitry 182 is responsive to a timer output of the processor 130 over a signal line 186. The rising edge of the timer output places the track and hold circuitry 182 in the hold mode, triggering a simultaneous sample or capture of the analog voltage and current signals.

The processor 130 programs the timer output to have a period equal to the desired synchronous, sample interval and a duty cycle which provides a hold signal to the track and hold circuitry 182 for the time duration required by a programmable A/D converter 188 to digitize all analog channels. In the preferred embodiment, the programmable A/D converter 188 is coupled to the track and hold circuitry 182 by signal lines 190 and to the signal conditioning circuitry 180 by a temperature line 192. The signal lines 190 represent seven analog channels that carry the analog voltage signals ($V_1$, $V_2$, $V_3$) and the analog currents signals ($I_1$, $I_2$, $I_3$, $I_4$) into the A/D converter 188, and the temperature line 192 represents the eighth analog channel that carries the temperature signal directly to the A/D converter.

At the rising edge of the timer output, the track and hold circuitry 182 is placed in the hold mode and, thereby, simultaneously capturing or acquiring the seven analog channels representing the analog voltage and the analog current signals for conversion by the A/D 188. In the preferred embodiment, the first analog channel is temperature which is directly routed to a sample/hold circuit 194 of the A/D 188. In this preferred embodiment, the programmable A/D converter 188, such as a LM12458 Programmable A/D converter made by National Semiconductor, includes the sample/hold circuit 194, a FIFO buffer 196 and an analog multiplexor (MUX) 198.

The programmable A/D converter 188 is also responsive to the timer output. The rising edge of the timer output causes the sample/hold circuitry 194 to hold the Temperature signal on the temperature line 192 and triggers the A/D 188 to begin conversion of the first analog channel (Temperature). At the same time, as described above, the rising edge of the timer output takes a snap shot of the waveform passing through the branch 102 (FIG. 1) by simultaneously capturing or acquiring all of the analog voltage and current signals for the waveform. As previously stated, the processor 130 programs the timer output such that the timer output remains high until the A/D 188 completes the conversion of all eight analog channels.

The high level on the timer output keeps the track and hold circuitry 182 in the hold mode, thereby holding those analog voltage and current signals that occurred at the rising edge of the timer output so that the A/D converter 188 can digitize them. In the preferred embodiment, the A/D 188 converts each analog channel into a 12-bit digital value and stores each of the digital values in the FIFO buffer 194 of the A/D 188. When the number of samples in the FIFO buffer 196 exceeds a programmed setpoint, the A/D sends a DMA request to the microprocessor over a DMA request line 197 to empty the FIFO buffer 196.

Upon receipt of the DMA request, the processor 130 initiates a DMA transfer of the digital data from the FIFO buffer 196 to the processor memory. The processor 130 includes DMA controller circuitry for performing the DMA transfer. Normal DMA transfers allow multiple data transfers from a single fixed memory location or from sequential memory locations to the same number of sequential memory locations. To transfer a 12-bit sample value from the FIFO buffer 196 of the A/D 188 over an 8bit wide data bus, two sequential memory locations, addr0 and addr1, that correspond to the FIFO buffer 196 must be read and transferred to two sequential memory locations in memory. In the preferred embodiment, the DMA circuitry of the processor 130 presents a fixed source address that corresponds to addr0 over an address bus (not shown) of the I/O bus 132 and fetches the least significant 8-bits or byte (LSB) of the 12-bit sample value from the FIFO 196 at addr0.

The DMA circuitry transfers the LSB over the data bus (not shown) of the I/O bus 132 through the CPU I/O 140 to a destination address in the memory. After the DMA controller circuitry fetches the initial LSB of the sample value, the DMA circuitry of the processor 130 increments the destination address, and a DMA enhancement circuitry 200 controls a least significant address bit (LA0) of the A/D 188. The LA0 bit of the A/D 188 is controlled by the output of an exclusive-OR gate (not shown) which performs an exclusive OR operation on the least significant bit of the fixed source address from the processor 130 and the output of a T flip-flop (not shown). As such, the least significant bit of the fixed source address from the processor 130 is controlled by the DMA enhancement circuitry 200 so that the address actually received by the A/D 188 corresponds to the addr1. The Addr1 holds the most significant byte of the 12-bit sample value in the FIFO 196.

The processor 130 keeps the T flip-flop in the cleared state during all normal read and write operations to the A/D 188 by sending a reset signal through the CPU I/O 140 on reset line 202. In this case the LA0 bit of the A/D 188 is equal to the least significant bit of the fixed source address on the address bus. When DMA transfer begins, the clear on the flip-flop is removed, allowing the T flip-flop to be clocked by each read access of the A/D 188 during the DMA. At the time that a DMA request is received by the processor 130, the output of the T flip-flop=0. As such, the output of the exclusive-or gate reflects the least significant bit of the fixed source address, and the DMA circuitry of the processor 130 fetches and stores the LSB of the sample value from addr0 as described above.

By programming the DMA controller on the processor 130 to perform data transfers from a fixed memory location with the least significant bit=0, the LA0 bit of the A/D 188 is now controlled by the output of the T Flip-flop. After the initial reading of the LSB, the T flip-flop is clocked and toggles to have an output=1. In this way, when the DMA circuitry attempts to read another sample value from the fixed source address corresponding to addr0, the exclusive-or gate causes the LA0 bit of the A/D 188 to toggle. Accordingly, the source address received by the A/D 188 coincides with addr1 which contains the most significant byte (MSB) of the sample value in the FIFO buffer 196. Therefore, the DMA of the processor 130 fetches the MSB of the sample value and stores MSB in the incremented destination address in the memory.

After the sample value is read from the two sequential addresses, addr0 and addr1, corresponding to the FIFO 196, the FIFO shifts so that the next sample value in the FIFO 196 occupies addr0 and addr1. DMA now performs multiple data transfers from data locations addr0 and addr1 to sequential memory locations.

In the preferred embodiment, the FIFO 196 stores 32 sample values. Incidently, thirty-two sample values coincides with four rising edges of the timer output because the data acquisition circuitry 120 acquires eight digital sample values for every sample of the waveform. When the FIFO is filled with 32 sample values, the A/D 188 generates the DMA request to the DMA circuitry of the processor 130 to empty the FIFO buffer 196. As described above, the DMA circuitry together with the DMA enhancement circuitry 200 will transfer the 32 digital sample values with 64 fetches from the memory of the A/D 188. At the end of the DMA transfer, the DMA controller circuitry provides an end of DMA transfer interrupt to the processor 130 itself, and the processor 130 clears the T flip-flop for normal operation. Alternatively, the DMA enhancement circuitry 200 would not be necessary if a 16-bit data bus were used, but the 8-bit data bus is low in cost as are the components of the DMA enhancement circuitry 200. Moreover, the precise numbers mentioned, such as FIFO buffer size and bit sizes, reflect the preferred embodiment and do not limit the present invention.

After the digital sample values are stored in memory, the processor performs numerous power-related calculations using the digital sample values and power-related calculation values derived from the digital sample values by executing various routines in the firmware that perform numerous demand and power-related computations. As such, the firmware determines the type of calculations to be performed, and the number and type of calculations found in the firmware can vary depending on the application.

In addition to executing power-related computation routines, the processor 130 performs general operating system instructions in the main firmware program that include calls to other routines in the firmware, such as a frequency determination routine, a non-maskable interrupt (NMI) routine that is utilized by the non-volatile memory protection feature and an alarm condition capture routine.

Importantly, while the processor 130 is executing the power-related calculation routines and the other routines as dictated by the firmware, the data acquisition circuitry 120 continues sampling the waveform according to the sampling frequency dictated by the timer output of the processor 130. Additionally, the DMA controller circuitry of the processor 130 performs DMA transfers during the execution of the various firmware routines by the processor 130. Consequently, the metering unit 104 makes efficient use of the processor due, in large part, to the design of the data acquisition circuitry that requires minimal processor power, enabling the processor 130 to execute the firmware routines in parallel with waveform sampling or captures and eliminating the "blind time" of the metering unit 104 with respect to the waveform.

To ensure the accuracy of the waveform sampling process and the power-related calculations, the processor 130 regularly executes a frequency determination routine to determine whether the sampling frequency accurately reflects the frequency of the sampled waveform. To accomplish this, the processor uses the digital sample values stored in memory that represent previous cycles of the sample waveform. The processor 130 utilizes the digital sample values to locate the exact points at which zero-crossings of the sample waveform occur and, thereby, determine the cycle time for the sampled waveform. In the preferred embodiment, the processor 130 performs waveform frequency determinations using an assumed (default) waveform frequency of 60 Hz (a cycle time of 16.67 ms), by analyzing the digital sample values until at least two zero crossings are detected, and then calculating the time between zero-crossings to calculate the waveform cycle time. In the preferred embodiment, this cycle time is desirably divided by 64 (the preferred number of waveform samples or capture per waveform cycle) to establish the time interval between samples or captures of the waveform ("inter-sample time interval").

The frequency determination routine desirably analyzes digital samples representing a number of integral cycles to provide an accurate frequency determination for the sampled waveform. In fact, the processor 130 executing the firmware preferably passes six waveform cycles of digital sample values down to four cycles of accurate digital sample values for improved accuracy in both frequency determinations and the power-related calculations. Additionally, if changes are detected in the time between zero-crossings, the processor 130 recalculates the inter-sample time interval for the next cycle, with preferably 64 samples or captures taken between the zero crossings defining that cycle. Accordingly, the processor 130 programs the timer output to reflect the new inter-sample time interval for simultaneously capturing the analog signal parameters for the waveform.

Furthermore, in the case of an alarm condition or another event, such as the activation of the interruption device 103, the processor 130 can execute the alarm condition routine that provides power-related information derived from the digital sample values representing preferably twelve consecutive waveform cycles. The twelve consecutive waveform cycles can include, depending on the application, waveform cycles previous to and subsequent to the event.

For example, the metering unit 104 can focus on the power-related information derived from digital sample values representing both the six waveform cycles before the event and the six waveform cycles after the event. In addition to the firmware routines specifically mentioned, the processor 130 must perform various firmware routines including but not limited to checking for an event to trigger the alarm condition routine, strobing the watchdog timer circuitry, handling key presses on the keypad/display circuitry, handling communications with the control station 108, carrying out commands from the control station 108, setting minimum and maximum values relating to the demand and power-related calculations and logging data into log files.

Figures 5A, 5B:
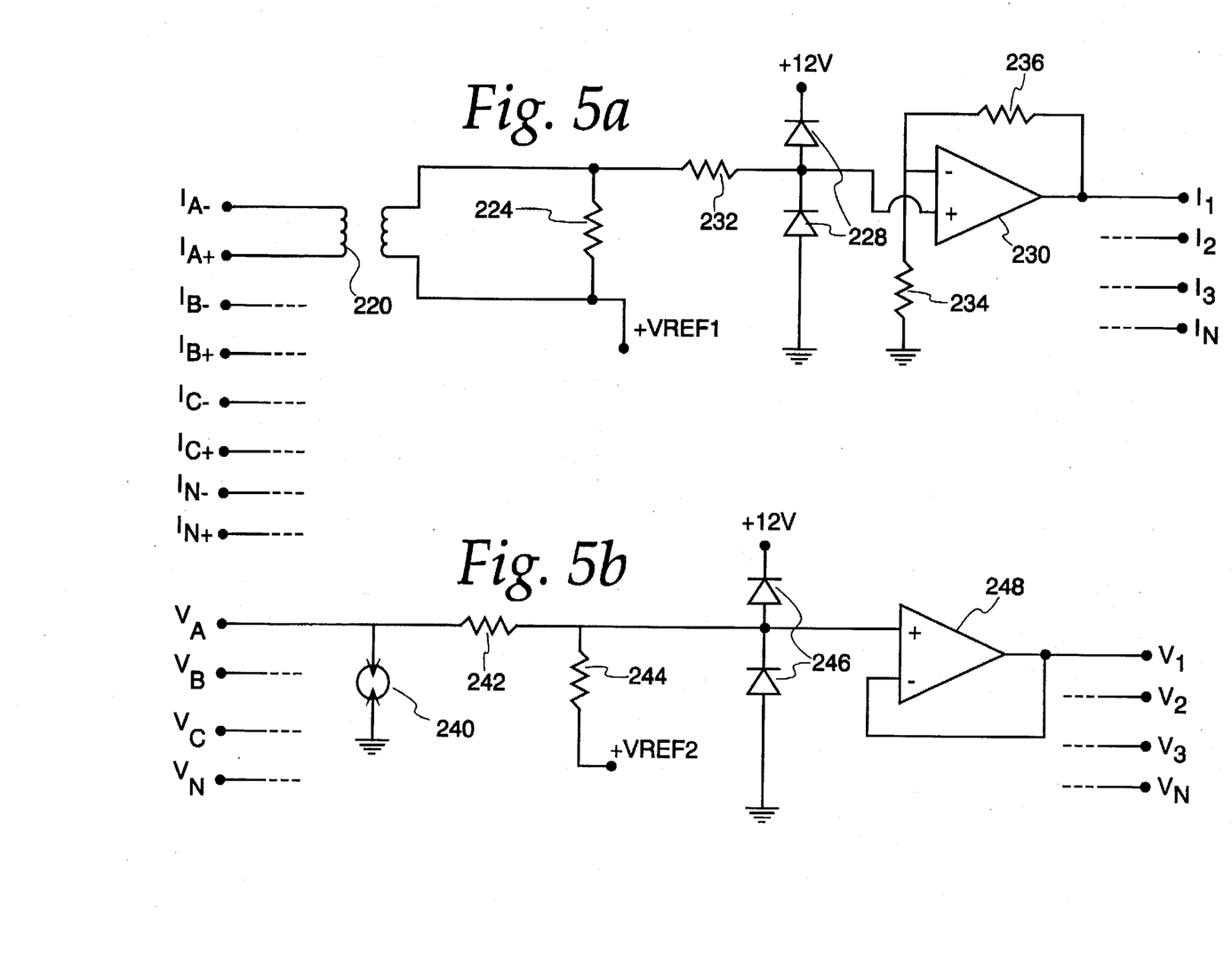
FIGS. 5a and 5b comprise a circuit diagram of the signal conditioning circuitry, which is part of the metering unit of FIG. 3.

FIGS. 5a and 5b show the signal conditioning circuitry 180 of the data acquisition circuitry 120. The signal conditioning circuitry 180 includes two types of circuits for presenting the power-related information from the eight input lines of the metering unit 104 to the remaining circuitry. In FIG. 5a, a current sensor circuit is shown for coupling the current sensed by each associated CT 110 (FIG. 2) to the remaining data acquisition circuitry 120 of FIG. 3. The respective inputs to each of these three identical circuits of FIG. 5a are IA– and IA+, IB– and IB+, IC– and IC+ and IN– and IN+ and the respective outputs are I1, I2, I3 and IN.

The circuit of FIG. 5a includes a current transformer (CT) 220 for stepping-down the sensed current from a nominal 5 Amps to about 3 milli-Amps. The CT 220 utilizes relatively less magnetic material and, thereby, provides some protection against high level current transients. The CT 220 is connected to a DC reference voltage, $V_{ref1}$, to bias or offset the input signal for use by the remaining data acquisition circuitry 120. Using a voltage reference, such as 0.558 V, to offset the immediate input signal avoids having to use coupling capacitors and a negative analog power supply voltage, resulting in cost savings and increased reliability. The circuit also includes a 82.5 ohm resistor 224 for developing a voltage from the sensed current, and a 10 Kohm resistor 232 for limiting any surge currents. Diodes 228 protect against voltage transients greater than +12v or less than ground, and an operational amplifier 230 uses a 1.91 Kohm resistor 234 and a 6.65 Kohm resistor 236 to provide the appropriate signal amplification for the remaining data acquisition circuitry 120. The operational amplifier 230 is shown in a non-inverting configuration, and alternative values for the resistors 224, 232, 234 and 236 can be selected by someone of ordinary skill in the art to achieve the desired signal attenuation and amplification.

The voltage sensor circuit of FIG. 5b is used to couple the voltage sensed by each PT 112 (FIG. 2) to the remaining data acquisition circuitry 120 of FIG. 3. The respective inputs to each of these three identical circuits of FIG. 5b are $V_A$, $V_B$, $v_C$ and $V_N$ and its respective outputs are $V_1$, $V_2$, $V_3$ and $V_4$. Note, $V_4$ is not utilized in the preferred embodiment but can easily be included into the data acquisition circuitry 120. The circuit of FIG. 5b includes a surge arrestor or spark gap 240 for protection from high level voltage transients. The surge arrestor 240 also reduces the capacitive loading at the voltage input terminals that create phase and amplitude shifts over the range of input frequencies when used with resistive voltage dividers. Accordingly, the voltage sensor circuit of FIG. 5a also utilizes a relatively inexpensive voltage divider comprising a 2.00 Mohm resistor 242 and a 19.1 Kohm resistor 244 to attenuate the input voltage signals. If a surge arrestor were not used, Vref2 is connected to the resistor 244 and biases or offsets the input voltage signal. Diodes 246 protect against voltage transients greater than +12v or less than ground, and an operational amplifier 248 which acts as a unity gain buffer for the remaining data acquisition circuitry 120 of FIG. 3. The resistor 242 and 244 can be selected by someone of ordinary skill in the art to achieve the desired signal.

Each of the components illustrated in FIGS. 5a and 5b is conventional and readily available from a number of commercial suppliers.

To prevent loss of data in the event of a power failure, the improved metering unit 104 of the present invention includes a contiguous non-volatile memory protection feature that causes the processor 130 to store set-up and operational data which may be sent from the control station 108 or other data, acquired or calculated, by the metering unit 104. In the preferred embodiment, the contiguous non-volatile memory protection feature is utilized in the improved metering unit. This feature, however, can be incorporated into any system utilizing and storing data in a contiguous non-volatile memory. For example, when a microprocessor-based device which maintains non-volatile memory experiences loss of control power steps must taken to insure that the non-volatile memory is not corrupted, for instance if a set of contiguous bytes representing some data in non-volatile were being written when control power were lost, the data would be "torn", consisting partially of new data and partially of previous data. This feature prevents data corruption on loss of control power.

In the preferred embodiment, the non-volatile memory protection feature provides the improved metering unit 104 with a method for insuring the integrity of non-volatile data upon the loss of control power. The non-volatile memory protection feature can utilize the power supply 168 for the improved metering unit 104 described above. The device power supply 168 (FIG. 3) monitors the control power and provides an interrupt signal (Power Fail Signal) to the processor some period of time before the power supply 168 will drop it's VCC for the processor 130. The period of time required from the time the Power Fail Signal occurs to the time VCC drops out of regulation varies from one application to the over, but the minimum period of time is equal (Maximum time required to write any one set of data)+ (Time required to service the Power Fail Signal interrupt).

Figure 6A:
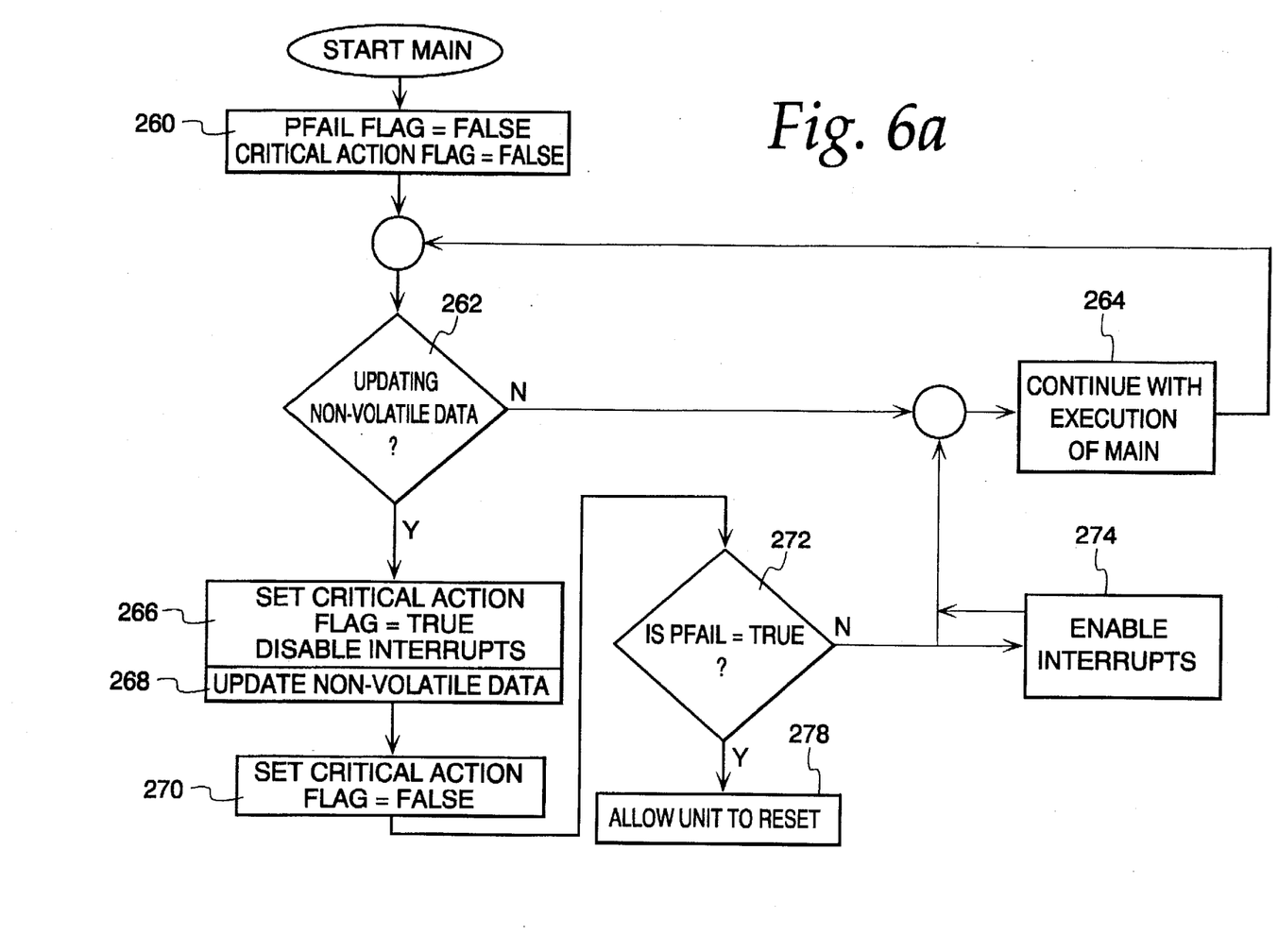
FIGS. 6a and 6b are flow diagrams for the non-volatile memory protection feature of the improved metering unit of FIG. 3.
Figure 6B:
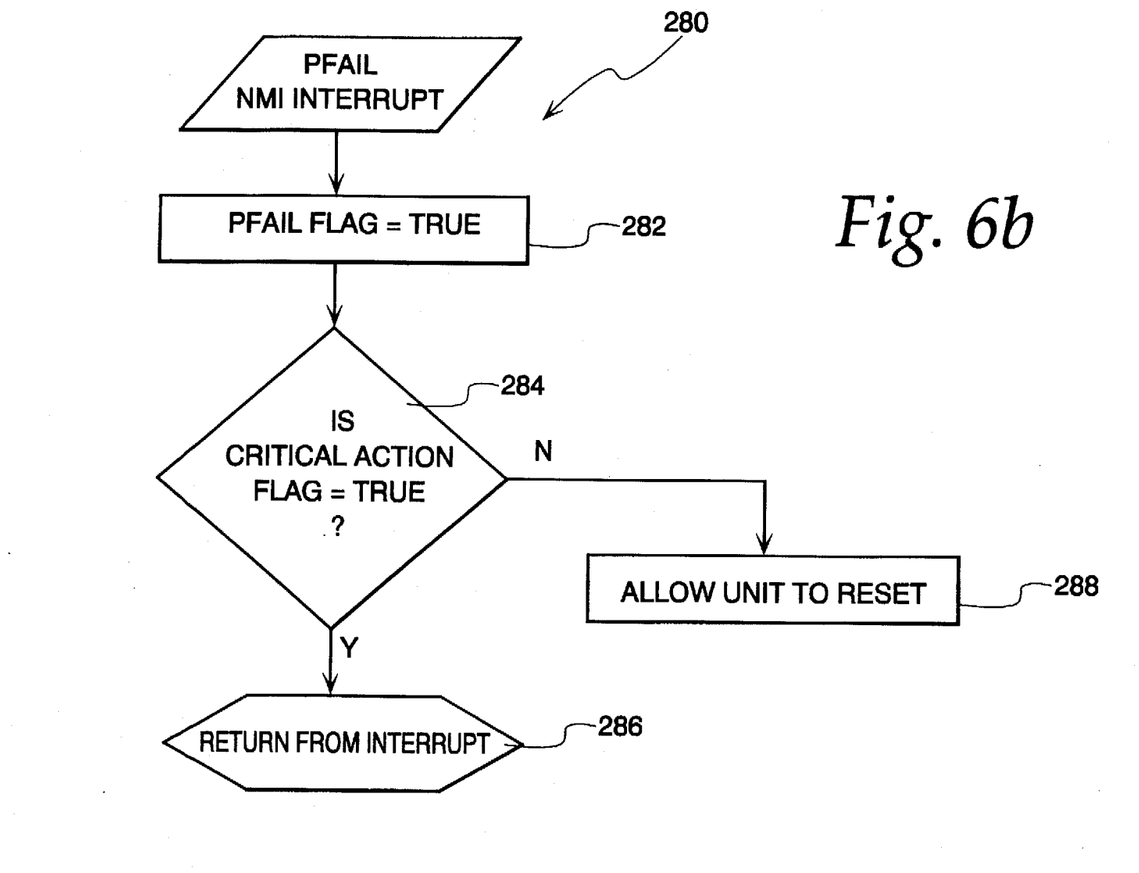

FIGS. 6a and 6b show a flow diagram for the non-volatile memory protection feature utilized by the metering unit 104. The firmware has the following routines and flags in place: Critical Action Flag, Power Fail Flag, Power Fail ISR. Initially, while the processor 130 is performing operations that do not involve writing into the non-volatile memory, step 260 shows that both the Power Fail Flag=False and the Critical Action Flag=False. At step 262, the processor 130 determines whether a set of contiguous non-volatile data is to be written. If not, the contiguous non-volatile memory protection feature is not activated, and the processor 130 continues operating according to the firmware as shown in step 264. Whenever a set of contiguous non-volatile data is about to be written, the non-volatile memory protection feature becomes active on the processor 130 by setting the Critical Action Flag to True at 266. When the Critical Action Flag is True, the processor 130 is writing to non-volatile memory. Step 266 also disables all interrupts with the exception of the Power Fail interrupt. After the data has been written to the non-volatile memory at step 268, the Critical Action Flag is set to False at step 270, and the Power Fail Flag is checked at step 272. If the power fail flag is False, the protection feature enables all interrupts at step 274 and returns to normal operation at step 264. If the Power Fail Flag is true, the protection feature has already updated the non-volatile memory, thereby prohibiting a processor reset during the writing to non-volatile memory. At this point, the processor 130 will not perform any more non-volatile write activities, and the protection feature allows or forces the processor 130 to reset at step 278.

FIG. 6b shows the flow diagram for the Power Fail ISR routine 280. This routing simply set the Power Fail Flag to true to signal an impending control power shortage. When a power fail interrupt signal is received by the processor 130, the Power Fail ISR 280 will set the Power Fail Flag to True at step 282 and then check the Critical Action Flag at step 284. If the Critical Action Flag is true, signalling write operations to non-volatile memory, the power fail ISR 180 will end and return execution to the critical task at step 286 and allow the processor 130 to finish writing to the non-volatile memory before the processor 130 resets. If the Critical Action Flag is false, the power fail ISR 280 will allow or force the device to reset at step 288.

While the invention has been particularly shown and described with reference to a particular embodiment, it will be recognized by those skilled in the art that modifications and changes may be made to the present invention described above without departing from the spirit and scope thereof.

What is claimed is:

1. A metering unit for monitoring power in a distributed power network, wherein a power-related, multi-phase waveform passes through a power line and zero-crossings of the waveform define its cycles, said metering unit comprising:

signal conditioning circuitry disposed adjacent to the power line, for sensing desired phases of analog voltage and current associated with said waveform;

a processor generating a timer output and including DMA controller circuitry;

track and hold circuitry responsive to said timer output for simultaneously capturing intra-cycle voltage values and intra-cycle current values corresponding to each of said desired phases of said distributed power network;

an analog to digital converter coupled to said track and hold circuitry and responsive to said timer output for producing a plurality of distal samples from said intra-cycle voltage values and said intra-cycle current values, said analog to digital converter including a FIFO buffer storing said digital samples, said analog to digital converter providing a transfer signal to said processor upon the filling of said FIFO buffer for initiating a DMA transfer of said digital samples to a memory, said DMA controller circuitry generating a single source address to said FIFO buffer to transfer a portion of each digital sample from said FIFO buffer to said memory;

DMA enhancement circuitry altering said source address received by said FIFO buffer to transfer a remaining portion of each digital sample from said FIFO buffer to said memory during said DMA transfer while said source address generated by said DMA controller circuitry remains the same; and means for performing at least one power-related calculation for said distributed power network by directly using said digital samples in said memory.

2. The metering unit of claim 1 wherein said processor includes a frequency determinator to determine a frequency of said waveform, said processor responsive to said frequency determinator and programming said timer output in response to said frequency.

3. The metering unit of claim 1 wherein said timer output has a duty cycle, said A/D converter digitizing said intra-cycle voltage values and said intra-cycle current values within said duty cycle.

4. The metering unit of claim 3 wherein said track and hold circuitry holds said analog voltage and current parameters while said A/D converter digitizes said intra-cycle voltage values and said intra-cycle current values.

5. The metering unit of claim 1 further including non-volatile memory and a power supply providing a power fail signal to said processor upon an impending power loss, wherein said processor includes a non-volatile memory protection feature responsive to said power fail signal which prevents said processor from resetting until said processor completes writing into non-volatile memory.

6. The metering unit of claim 5 wherein said non-volatile memory protection feature includes a critical action flag and a power fail flag, said critical action flag indicating a write to said non-volatile memory, and said power fail flag responsive to said power fail signal.

7. The metering unit of claim 1 wherein said DMA enhancement circuitry toggles said least significant bit of said source address from said DMA controller circuitry while said source address generated by said DMA controller circuitry remains the same to transfer all of said digital samples in said buffer to said memory before said DMA transfer ends.

8. A method for monitoring power in a distributed power network, wherein a power-related, multi-phase waveform passes through a power line and zero-crossings of the waveform define its cycles, said method comprising the steps of:

sensing desired phases of analog voltages and currents associated with said waveform;

generating a timer output;

simultaneously capturing intra-cycle voltage values and intra-cycle current values corresponding to each of said desired phases of said distributed power network;

converting said intra-cycle voltage values and said intra-cycle current values into digital samples in response to said timer output;

storing said digital samples in a FIFO buffer;

providing a transfer signal to a processor upon the filling of the FIFO buffer for initiating a DMA transfer of said digital samples to a memory;

generating a single source address to said FIFO buffer by said processor to transfer a portion of each digital sample from said FIFO buffer to said memory;

altering said source address received by said FIFO buffer by DMA enhancement circuitry to transfer a remaining portion of each digital sample from said FIFO buffer to said memory during said DMA transfer while said address generated by said processor remains the same; and performing at least one power-related calculation for said distributed power network by directly using said digital samples in said memory.

9. The method of claim 8 further comprising the steps of:

determining the frequency of said waveform; and programming said timer output in response to said frequency determination.

10. The method of claim 8 further comprising the steps of:

providing said timer output with a duty cycle; and digitizing said intra-cycle voltage values and said intra-cycle current values within said duty cycle.

11. The method of claim 10 further comprising the step of holding said intra-cycle voltage values and said intra-cycle current values while said A/D converter digitizes said intra-cycle voltage values and said intra-cycle current values.

12. The method of claim 8 further comprising the steps of:

providing a power fail signal to said processor upon an impending power loss; and responding to said power fail signal when said processor is updating non-volatile memory by preventing said processor from resetting until said processor completes writing into non-volatile memory.

13. The method of claim 12 further comprising the steps of:

setting a critical action flag to indicate a write to said non-volatile memory; and setting said power fail flag in response to said power fail signal.

14. A metering unit for monitoring power in a distributed power network, wherein a power-related, multi-phase waveform passes through a power line and zero-crossings of the waveform define its cycles, said metering unit comprising:

an analog to digital converter producing digital samples from intra-cycle voltage values and intra-cycle current values and having a buffer, said buffer storing said digital samples;

a memory coupled to said analog to digital converter [for storing said digital];

a processor including DMA controller circuitry responsive to a transfer signal from said analog to digital converter upon the filling of said buffer for initiating a DMA transfer of said digital samples from said buffer to said memory, said DMA controller circuitry generating a source address to said buffer to transfer a portion of each digital sample from said buffer to said memory; and DMA enhancement circuitry altering said source address received by said buffer to transfer a remaining portion of each digital sample from said buffer to said memory during said DMA transfer while said source address generated by said DMA controller circuitry remains the same.

15. The metering unit of claim 14 wherein said DMA enhancement circuitry toggles said least significant bit of said source address from said DMA controller circuitry while said source address generated by said DMA controller circuitry remains the same to transfer all of said digital samples in said buffer to said memory before said DMA transfer ends.

16. A method for monitoring power in a distributed power network, wherein a power-related, multi-phase waveform passes through a power line and zero-crossings of the waveform define its cycles, said method comprising the steps of:

converting intra-cycle voltage values and intra-cycle current values into digital samples;

storing said digital samples in a buffer;

providing a transfer signal to a processor upon the filling of the buffer to initiate a DMA transfer of said digital samples to a memory;

generating an address to said buffer by said processor to transfer a portion of each digital sample from said buffer to said memory; and altering said address received by said buffer by DMA enhancement circuitry to transfer a remaining portion of each digital sample from said buffer to said memory during said DMA transfer while said address generated by said processor remains the same.

* * * * *